US010418533B2

(12) United States Patent
Abe et al.

(10) Patent No.: US 10,418,533 B2
(45) Date of Patent: Sep. 17, 2019

(54) LIGHT-EMITTING DEVICE HAVING A LIGHT-TRANSMISSIVE MEMBER INCLUDING PARTICLES OF AT LEAST ONE FIRST FILLER AND METHOD FOR MANUFACTURING THE SAME

(71) Applicant: NICHIA CORPORATION, Anan-shi (JP)

(72) Inventors: Koji Abe, Tokushima (JP); Yasushi Okamoto, Itano-gun (JP)

(73) Assignee: NICHIA CORPORATION, Anan-shi (JP)

(*) Notice: Subject to any disclaimer, the term of this patent is extended or adjusted under 35 U.S.C. 154(b) by 32 days.

(21) Appl. No.: 15/609,028

(22) Filed: May 31, 2017

(65) Prior Publication Data

US 2017/0345982 A1 Nov. 30, 2017

(30) Foreign Application Priority Data

May 31, 2016 (JP) .................................. 2016-109433

(51) Int. Cl.
*H01L 33/50* (2010.01)
*H01L 33/58* (2010.01)
(Continued)

(52) U.S. Cl.
CPC .......... *H01L 33/58* (2013.01); *H01L 25/0753* (2013.01); *H01L 33/486* (2013.01);
(Continued)

(58) Field of Classification Search
CPC ....... H01L 33/54; H01L 33/58; H01L 33/486; H01L 33/502; H01L 33/56; H01L 33/62;
(Continued)

(56) References Cited

U.S. PATENT DOCUMENTS

2002/0015193 A1 2/2002 Tabata
2002/0039001 A1 4/2002 Nagai et al.
(Continued)

FOREIGN PATENT DOCUMENTS

JP 07-218705 8/1995
JP 10-048985 2/1998
(Continued)

OTHER PUBLICATIONS

Extended European Search Report for corresponding EP Application No. 17173643.2-1551, dated Aug. 1, 2017.

*Primary Examiner* — Matthew C Landau
*Assistant Examiner* — Gustavo G Ramallo
(74) *Attorney, Agent, or Firm* — Mori & Ward, LLP

(57) ABSTRACT

A light-emitting device includes a package, a light-emitting element disposed on the package, and a light-transmissive member over the light-emitting element. An upper surface of the light-transmissive member and an upper surface of the package each have a plurality of projections. The light-transmissive member contains particles of light-transmissive first fillers having refractive indices smaller than the refractive index of a matrix of the light-transmissive member. Part of the particles of the first fillers is exposed to the air from the matrix of the light-transmissive member on the upper surface of the light-transmissive member.

10 Claims, 11 Drawing Sheets

(51) Int. Cl.
*H01L 25/075* (2006.01)
*H01L 33/48* (2010.01)
*H01L 33/56* (2010.01)
*H01L 33/62* (2010.01)
*H01L 33/54* (2010.01)

(52) U.S. Cl.
CPC ............ *H01L 33/502* (2013.01); *H01L 33/54* (2013.01); *H01L 33/56* (2013.01); *H01L 33/62* (2013.01); *H01L 2224/48091* (2013.01); *H01L 2224/48247* (2013.01); *H01L 2224/48257* (2013.01); *H01L 2924/181* (2013.01); *H01L 2933/005* (2013.01); *H01L 2933/0041* (2013.01); *H01L 2933/0058* (2013.01); *H01L 2933/0066* (2013.01); *H01L 2933/0091* (2013.01)

(58) Field of Classification Search
CPC ..... H01L 33/50; H01L 33/508; H01L 33/501; H01L 33/504; H01L 33/505; H01L 33/507; H01L 25/0753
See application file for complete search history.

(56) References Cited

U.S. PATENT DOCUMENTS

| | | | |
|---|---|---|---|
| 2005/0152127 A1 | 7/2005 | Kamiya et al. | |
| 2006/0040204 A1 | 2/2006 | Nagahama et al. | |
| 2006/0234409 A1* | 10/2006 | Nagai | H01L 25/0753 438/26 |
| 2007/0145404 A1* | 6/2007 | Murayama | H01L 33/58 257/99 |
| 2009/0239388 A1 | 9/2009 | Izuno et al. | |
| 2010/0167019 A1 | 7/2010 | Ohyanagi et al. | |
| 2010/0230694 A1 | 9/2010 | Arndt et al. | |
| 2010/0237382 A1 | 9/2010 | Kamei | |
| 2010/0284190 A1 | 11/2010 | Oide et al. | |
| 2011/0114989 A1 | 5/2011 | Suehiro et al. | |
| 2012/0161621 A1 | 6/2012 | Sato | |
| 2013/0011617 A1 | 1/2013 | Tasaki et al. | |
| 2014/0028173 A1 | 1/2014 | Tsuchiya et al. | |
| 2014/0231844 A1 | 8/2014 | Akimoto et al. | |
| 2014/0231845 A1 | 8/2014 | Akimoto et al. | |
| 2015/0028373 A1 | 1/2015 | Abe et al. | |
| 2015/0275074 A1* | 10/2015 | Liu | C09K 11/025 264/21 |
| 2016/0365541 A1* | 12/2016 | Wehlus | C03C 14/004 |

FOREIGN PATENT DOCUMENTS

| | | |
|---|---|---|
| JP | 2001-257410 | 9/2001 |
| JP | 2001-343531 | 12/2001 |
| JP | 2002-201076 | 7/2002 |
| JP | 2003-086846 | 3/2003 |
| JP | 2004-221163 | 8/2004 |
| JP | 2004-231513 | 8/2004 |
| JP | 2005-183777 | 7/2005 |
| JP | 4442216 B2 | 7/2005 |
| JP | 4238792 B2 | 2/2006 |
| JP | 2007-243053 | 9/2007 |
| JP | 2007-266246 | 10/2007 |
| JP | 2007-324220 | 12/2007 |
| JP | 2009-070869 | 4/2009 |
| JP | 4678437 B2 | 7/2010 |
| JP | 2011-129862 | 6/2011 |
| JP | 2012-151466 | 8/2012 |
| JP | 2013-218245 | 10/2013 |
| JP | 2014-041993 | 3/2014 |
| JP | 2014-157989 | 8/2014 |
| JP | 2014-157990 | 8/2014 |
| JP | 2014-241313 | 12/2014 |
| JP | 2015-026698 | 2/2015 |
| JP | 2015-173287 | 10/2015 |
| JP | 2016-021435 | 2/2016 |
| JP | 2016-136232 | 7/2016 |
| WO | WO 2008/023797 | 2/2008 |
| WO | WO 2009/054088 | 4/2009 |
| WO | WO 2011/118108 | 9/2011 |
| WO | WO 2013/157310 | 10/2013 |
| WO | WO 2016/113970 | 7/2016 |

* cited by examiner

US 10,418,533 B2

LIGHT-EMITTING DEVICE HAVING A LIGHT-TRANSMISSIVE MEMBER INCLUDING PARTICLES OF AT LEAST ONE FIRST FILLER AND METHOD FOR MANUFACTURING THE SAME

CROSS-REFERENCE TO RELATED APPLICATIONS

The present application claims priority under 35 U. S. C. § 119 to Japanese Patent Application No. 2016-109433, filed May 31, 2016. The contents of this application are incorporated herein by reference in their entirety.

BACKGROUND OF THE INVENTION

1. Field of the Invention

The present invention relates to a light-emitting device including a light-emitting element, and a method for manufacturing the light-emitting device.

2. Description of Related Art

Light-emitting diodes (LEDs) have various applications such as lighting apparatuses, personal computers, backlights for televisions, and large format displays. As the demands for LED light sources for such various applications increase, the need for improvement in light outputs of the LED light sources is increasing.

For example, Japanese Unexamined Patent Application Publication No. 2007-324220 discloses optical semiconductor devices that include wiring boards having depressed portions, light-emitting elements housed in the depressed portions, and light-transmissive encapsulating members encapsulating the light-emitting elements and having roughened surfaces. Japanese Unexamined Patent Application Publication No. 2012-151466 discloses light-emitting devices that include base substrates, light-emitting elements disposed on the base substrates, and encapsulating members encapsulating the light-emitting elements and containing filler particles on its surface so that the encapsulating members will have irregular shapes.

SUMMARY OF THE INVENTION

A light-emitting device according to an embodiment of the present disclosure includes a base, a light-emitting element disposed on the base, and a light-transmissive member covering the light-emitting element, the light-transmissive member and the base member having projections on upper surfaces thereof, the light-transmissive member containing particles of at least one light-transmissive first filler, the particles of the at least one light-transmissive first filler having refractive indices smaller than a refractive index of a matrix of the light-transmissive member, and a part of the particles of the at least one light-transmissive first filler being exposed from the matrix of the light-transmissive member on the upper surface of the light-transmissive member.

A method for manufacturing a light-emitting device according to an embodiment of the present disclosure, the light-emitting device including a base, a light-emitting element disposed on the base, and a light-transmissive member covering the light-emitting element, includes forming the light-transmissive member over the light-emitting element after disposing the light-emitting element on the base, and abrasive-blasting an upper surface of the light-transmissive member and an upper surface of the base, in the forming of the light-transmissive member, the light-transmissive member being formed using a resin material, the resin material including a light-transmissive resin as a matrix and particles of at least one light-transmissive first filler having refractive indices smaller than a refractive index of the matrix, and in the abrasive blasting, a part of the particles of the at least one light-transmissive first filler being exposed from the matrix of the light-transmissive member on the upper surface of the light-transmissive member.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION OF EMBODIMENTS

Figure 1A:
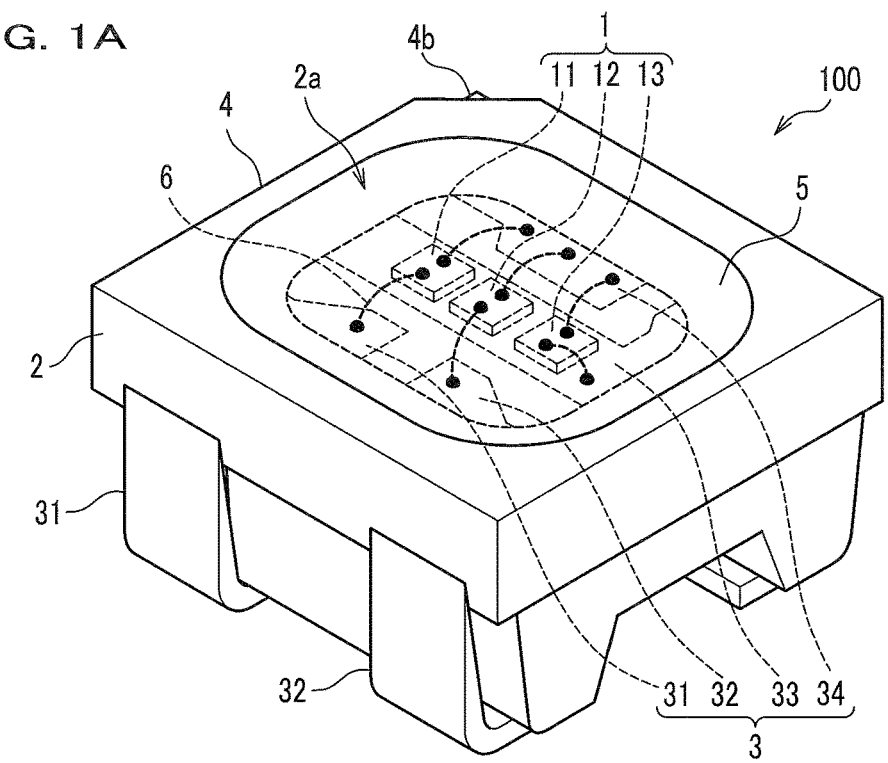
FIG. 1A is a schematic perspective view for illustrating a constitution of a light-emitting device according to a first embodiment.

The following describes light-emitting devices and methods for manufacturing the light-emitting devices according to embodiments. The drawings referred to in the descriptions below schematically illustrate the embodiments. The scales, the distances, the positional relations, and the like of members may be exaggerated, or illustration of part of the members may be omitted. Also, in the descriptions below, the same term or reference numeral generally represents the same member or a member made of the same material, and its detailed description will be omitted as appropriate.

First Embodiment

Constitution of Light-Emitting Device

A constitution of a light-emitting device according to a first embodiment will be described referring to FIG. 1A to FIG. 1C.

Figure 1B:
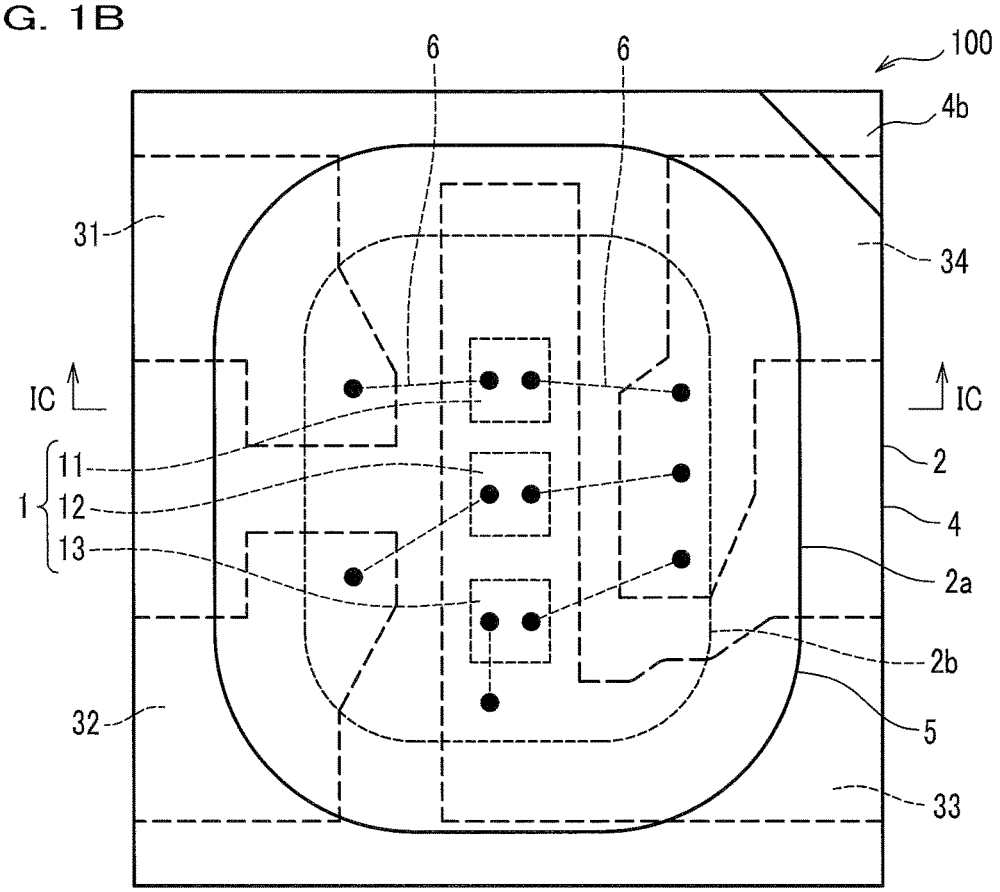
FIG. 1B is a schematic plan view for illustrating the constitution of the light-emitting device according to the first embodiment.

FIG. 1A is a schematic perspective view for illustrating the constitution of the light-emitting device according to the first embodiment. FIG. 1B is a schematic plan view for illustrating the constitution of the light-emitting device according to the first embodiment. FIG. 1C is a schematic cross-sectional view for illustrating the constitution of the light-emitting device according to the first embodiment taken along the line IC-IC in FIG. 1B.

Figure 1C:
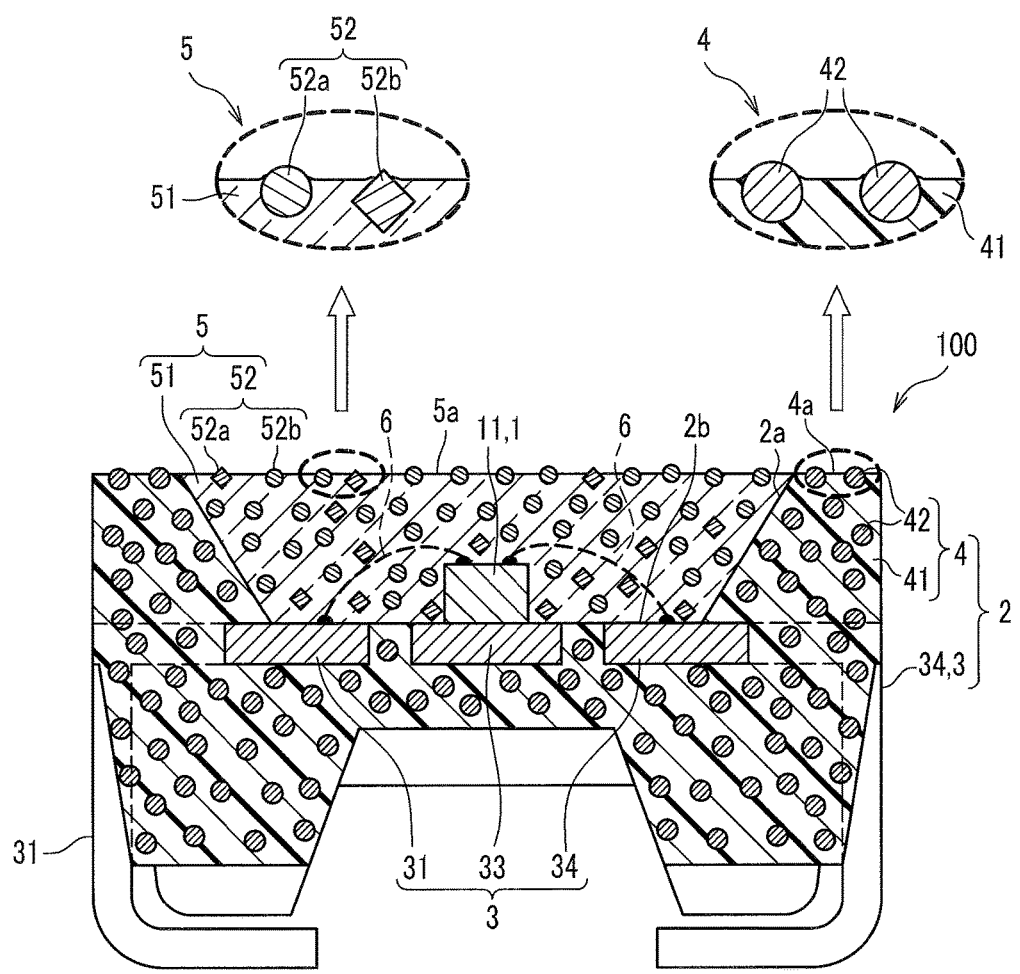
FIG. 1C is a schematic cross-sectional view for illustrating the constitution of the light-emitting device according to the first embodiment taken along the line IC-IC in FIG. 1B.

In FIG. 1C, the enlarged diagrams respectively illustrate portions around the upper surfaces of a light-shielding member and a light-transmissive member enclosed by the dashed lines. In FIG. 1C, two types of first fillers are represented by circles and rhombi, and a second filler is represented by circles. These shapes do not represent specific shapes of corresponding members but are used for convenience to differentiate the types of filler particles.

A light-emitting device 100 according to the first embodiment includes a base, one or more light-emitting elements 1 disposed on the base, and a light-transmissive member 5 over the light-emitting elements 1. The upper surfaces of the light-transmissive member 5 and the base each have irregular shapes, that is, have a plurality of projections. The light-transmissive member 5 contains particles of light-transmissive first fillers 52 having refractive indices smaller than the refractive index of a matrix 51 of the light-transmissive member 5. Part of the particles of the first fillers 52 is exposed from the matrix 51 of the light-transmissive member 5 on the upper surface of the light-transmissive member 5. The base corresponds to a package 2.

More specifically, the light-emitting device 100 has an approximately square shape in a plan view and includes the package 2 having an upward-opening depressed portion 2a, the light-emitting elements 1 mounted in the depressed portion 2a, and the light-transmissive member 5 disposed in the depressed portion 2a and covering the light-emitting elements 1. The package 2 includes lead electrodes 3 and a light-shielding member 4. The light-emitting elements 1 are electrically connected using wires 6 to the lead electrodes 3 disposed on the bottom surface of the depressed portion 2a.

The light-emitting elements 1 are mounted in the depressed portion 2a of the package 2. In the present embodiment, three light-emitting elements 11, 12, and 13 that emit different colors of light are mounted in the depressed portion 2a. For example, the light-emitting element 11 can emit blue light, the light-emitting element 12 can emit green light, and the light-emitting element 13 can emit red light.

The term "light-emitting elements 1" may be used hereinafter in the case where the distinction between the three light-emitting elements 11, 12, and 13 is not required.

The light-emitting elements 11, 12, and 13 are die-bonded to a lead electrode 33 disposed on the central portion of a bottom surface 2b of the depressed portion 2a. Anodes, which are electrodes of one polarity, of the light-emitting elements 11, 12, and 13 are electrically connected to a lead electrode 34 using the wires 6. Cathodes, which are electrodes of the other polarity, of the light-emitting elements 11, 12, and 13 are electrically connected to respective lead electrodes 31, 32, and 33 using the wires 6. In other words, voltage can be independently applied to the three individual light-emitting elements 11, 12, and 13. This constitution enables the light-emitting elements 11, 12, and 13 to be lighted separately and allows for any adjustment of luminance levels of the light-emitting elements 11, 12, and 13, thereby allowing the emission color and the brightness of the light-emitting device 100 to be changed in a desired manner. Hence, the light-emitting device 100 can be used as a pixel in a color image display device.

The shape, size, semiconductor material, and the like of the light-emitting elements 1 used herein are not particularly limited. The emission colors of the light-emitting elements 1 can be selected from any appropriate wavelength in accordance with the intended use. A light-emitting element that has an emission wavelength in the near-ultraviolet to visible region and is made of a nitride semiconductor represented by $In_XAl_YGa_{1-X-Y}N$ ($0 \le X \le 1$, $0 \le Y \le 1$, $X+Y \le 1$) can be suitably used as the light-emitting element 11 or 12 emitting blue or green light. A GaAs, AlInGaP, or AlGaAs semiconductor can also be used as the light-emitting element 13 that emit red light.

In the present embodiment, the positive and negative electrodes of the light-emitting elements 1 may be disposed on the same side or may be disposed on different sides. In the case where the light-emitting elements 1 to be used have the positive and negative electrodes disposed on the same side, it does not matter whether the light-emitting elements 1 are face-up mounted or face-down mounted. In the case where a plurality of light-emitting elements 1 are mounted, elements of different mounting types may be mixed.

The number of the light-emitting elements 1 mounted in the depressed portion 2a is at least one. In the case where a plurality of light-emitting elements 1 are mounted, the combination of the emission colors the outer shapes of the light-emitting elements 1, and the like can be changed as appropriate.

The package 2 includes the lead electrodes 3 and the light-shielding member 4 and has an approximately square outer shape in a plan view. The package 2 has the upward-opening depressed portion 2a. The depressed portion 2a is a region on which the light-emitting elements 1 are mounted. The lead electrodes 3 and the light-shielding member 4 constitute the bottom surface 2b of the depressed portion 2a. The light-shielding member 4 constitutes the side walls of the depressed portion 2a.

The lead electrodes 3 include the four lead electrodes 31 to 34 and function as wirings for connecting the three light-emitting elements 11 to 13, which are electrically connected via the wires 6, to an external power supply.

Portions of the respective lead electrodes 31 to 34 constitute the bottom surface 2b of the depressed portion 2a. Each of the lead electrodes 31 to 34 extends to an edge of the light-shielding member 4 in a plan view, is bent down at the edge, extends along a lateral surface of the light-shielding member 4, and is further bent inward along the lower surface of the light-shielding member 4. The lower side of the light-emitting device 100 is the mounting surface. The portions of the lead electrodes 31 to 34 that are bent inward along the lower surface of the light-shielding member 4 function as bonding portions to which bonding is performed using an electrically-conductive bonding member such as solder.

Portions of the lead electrodes 31 to 34 exposed on the bottom surface 2b of the depressed portion 2a are electrically connected to the light-emitting elements 11 to 13 via the wires 6. The lead electrodes 31 to 33 are electrically connected to the respective cathodes of the light-emitting elements 11 to 13. The anodes of the light-emitting elements 11 to 13 are each electrically connected to the lead electrode 34.

The lead electrode 33 is disposed on the central portion of the bottom surface 2b of the depressed portion 2a and serves also as a region for disposing light-emitting elements to which the light-emitting elements 11 to 13 are bonded using die-bonding members.

The lead electrodes 3 can be formed by performing pressing such as punching and bending on a flat metal plate. The metal plate, which is a raw material, is not limited to particular materials among materials used for lead frames for packages of light-emitting elements. The thickness of the metal plate is selected as appropriate depending on the shape and the size of the package. The thickness is, for example, about 100 µm to 500 µm, further preferably 120 µm to 300 µm. Examples of the material of the metal plate include Cu-based alloys.

Portions of the upper surfaces of the lead electrodes 3 constituting the bottom surface 2b of the depressed portion 2a may be plated with a metal such as Ag, Au, and Ni to enhance the light-reflective properties or/and the bondability to the wires 6 and the die-bonding members.

The light-shielding member 4 holds the four lead electrodes 31 to 34 away from each other and constitutes the side walls of the depressed portion 2a. The light-shielding member 4 is made of a material that blocks light instead of transmitting the light. A light-reflective material that reflects light to block the light, or a light-absorptive material that absorbs light to block the light is used.

Specifically, the light-shielding member 4 can be formed of a resin material containing a light-transmissive resin as a matrix 41 and a second filler 42 as a filler for imparting light-shielding properties. On an upper surface 4a, which is the upper surface of the side walls of the depressed portion 2a, of the light-shielding member 4, part of the particles of the second filler 42 is exposed from the matrix 41, and the upper surface 4a has an irregular shape, or projections, caused by the particles of the second filler 42.

In the case where a light-reflective material is used for the light-shielding member 4, the light-shielding member 4 functions to direct back into the light-transmissive member 5 light that has been emitted from the light-emitting elements 1, propagated through the light-transmissive member 5, and reached the light-shielding member 4. This constitution can improve the light extraction efficiency from the upper surface of the light-emitting device 100.

In the case where a light-absorptive material is used for the light-shielding member 4, the light-shielding member 4 absorbs light that has been emitted from the light-emitting elements 1 and that enters the light-shielding member 4 through the light-transmissive member 5. Hence, light can be emitted only from the upper surface of the light-emitting device 100.

Regardless of whether a light-reflective or light-absorptive material is used for the light-shielding member 4, the light-shielding member 4 limits emission of light from the light-emitting device 100 to emission from the upper surface of the light-transmissive member 5. Hence, the light-emitting device 100 can achieve a high contrast between a light-emitting region and a non-light-emitting region, in other words, achieve what is called good "distinguishability".

Examples of a resin used for the matrix 41 of the light-shielding member 4 include thermoplastic resins and thermosetting resins.

Examples of thermoplastic resins include polyphthalamide resin, liquid crystal polymers, poly(butylene terephthalate) (PBT), and unsaturated polyesters.

Examples of thermosetting resins include epoxy resins, modified epoxy resins, silicone resins, and modified silicone resins.

In the case where the light-shielding member 4 has light-reflecting properties, the light-shielding member 4 can be formed of a resin material to which light-reflective properties are imparted by incorporating particles of a light-reflective substance as the second filler 42 in the matrix 41. Examples of the light-reflective substance include $TiO_2$, $Al_2O_3$, $ZrO_2$, and $MgO$.

The inner lateral surfaces of the depressed portion 2a preferably has a reflectance of equal to or more than 70%, more preferably equal to or more than 80%, in the wavelength range of light emitted from the light-emitting elements 1. The content of the second filler 42 that is the light-reflective substance in the light-shielding member 4 is in a range of 5% by mass to 50% by mass, preferably in a range of 10% by mass to 30% by mass.

The grain diameter of the second filler 42 is preferably in a range of about 0.1 µm to 0.5 µm. If the grain diameter of the second filler 42 is within this range, the light-shielding member 4 can get good light-reflective properties.

Unless otherwise noted, values of the grain diameters of various fillers, abrasive materials, and the like are determined by an air permeability method or Fisher-SubSieve-Sizers-No. (F.S.S.S. method) in the present specification.

The projections on the upper surface 4a of the light-shielding member 4 preferably have an arithmetic mean roughness Ra defined in JIS B 0601:2013 in a range of about 0.090 µm to 0.210 µm. In particular, if the upper surface 4a of the light-shielding member 4 has an arithmetic mean roughness Ra of equal to or more than 0.130 µm, outside light can be more efficiently scattered.

In the case where the light-shielding member 4 has light-absorbing properties, the light-shielding member 4 can be formed of a resin material to which light-absorbing properties are imparted by incorporating particles of a light-absorptive substance as the second filler 42 in the above matrix 41. Examples of the light-absorptive substance used as the second filler 42 include black pigments, more specifically, carbon pigments such as carbon black and graphite.

The grain diameter and the content in the case where a light-absorptive substance is used as the second filler 42 can be about the same as in the case of the above reflective substance. For example, about 1% by mass of carbon black can be added as the second filler 42. In addition, for example, about 25% by mass of another filler such as wollastonite, which functions as a reinforcing agent, may be added.

The light-shielding member 4 can be formed by molding with a mold, such as transfer molding, injection molding, and compression molding, or application such as screen printing, using a resin material to which light-reflective properties or light-absorbing properties are imparted by incorporating the second filler 42 in the matrix 41.

The projections on the upper surface 4a of the light-shielding member 4 can be formed by abrasive-blasting the upper surface 4a to expose part of the particles of the second filler 42 from the matrix 41. In other words, the projections on the upper surface 4a of the light-shielding member 4 are preferably formed in association with the particles of the second filler 42.

The projections formed in association with the particles of the second filler 42 having a grain diameter in the above range can well reduce a regularly-reflected light component of the outside light reflected on the upper surface 4a of the light-shielding member 4. In the case where the light-emitting device 100 is used as a pixel in an image display device, the regularly-reflected light component of the outside light is reduced even if the image display device is irradiated with the outside light, whereby the brightness and the color of the pixel can be recognized well independently of the direction of observation.

The light-transmissive member 5 is an encapsulating member disposed in the depressed portion 2a of the package 2 and encapsulating the light-emitting elements 1.

The light-transmissive member 5 contains the first fillers 52 as fillers for adjusting the viscosity of the uncured resin in forming the light-transmissive member 5 using a light-transmissive resin as the matrix 51 and for imparting light-diffusing properties to the light-transmissive member 5. On the upper surface 5a of the light-transmissive member 5, part of the particles of the first fillers 52 is exposed from the matrix 51, and the upper surface 5a has an irregular shape, or a plurality of projections, caused by the particles of the first fillers 52.

Only one type of first filler 52 may be contained in the light-transmissive member 5. Alternatively, two types of first fillers 52a and 52b may be contained as in the present embodiment, and equal to or more than three types is also possible. Specifically, the first filler 52a and the first filler 52b may be different from each other in material, or may be the same in material but different in grain diameters or shapes.

Also, the light-transmissive member 5 may contain particles of a light-absorptive substance such as carbon black as another filler to the extent that the light-transmissive properties are not impaired. Incorporating a proper amount of particles of a light-absorptive substance in the light-transmissive member 5 can prevent light regularly reflected on the surfaces of the lead electrodes 3 and the like from being emitted from the light-extracting surface. This constitution can improve light distribution properties of light emitted from the light-emitting device 100.

In addition, the light-transmissive member 5 may contain particles of materials such as a fluorescent material, a color pigment, and a light-diffusing substance having a refractive index larger than the refractive index of the matrix 51, as appropriate.

A light-transmissive thermosetting resin such as a silicone resin, an epoxy resin, and a urea-formaldehyde resin can be used as the matrix 51 of the light-transmissive member 5. Light-transmissive materials having refractive indices smaller than the refractive index of the matrix 51 are used as the first fillers 52. Specific examples of the first fillers 52 include $SiO_2$. For example, in the case where an epoxy resin having a refractive index of 1.53 is used as the matrix 51, $SiO_2$ having a refractive index of 1.46 can be used as one of the first fillers 52.

The grain diameters of the first fillers 52 are preferably in a range of about 0.5 µm to 10 µm. If the grain diameters of the first fillers 52 are within this range, the projections formed in association with the particles of the first fillers 52 can efficiently reduce the regularly-reflected light component of the outside light on the upper surface 5a.

The content of the first fillers 52 in the light-transmissive member 5 is preferably in a range of about 2% by mass to 40% by mass.

The projections on the upper surface 5a of the light-transmissive member 5 preferably have an arithmetic mean roughness Ra defined in JIS B 0601:2013 in a range of about 0.095 µm to 0.220 µm, more preferably equal to or less than 0.180 µm.

Exposing the first fillers 52 having refractive indices smaller than the refractive index of the matrix 51 on the upper surface 5a, which is the light-extracting surface of the light-emitting device 100, of the light-transmissive member 5 can reduce the difference in refractive indices between the light-transmissive member 5 and the air (refractive index of which is 1.0) that is a medium into which light is extracted. Also, since the difference in refractive indices at the interface from which light is extracted is reduced, the light reflectance at the interface can be reduced. Hence, the light extraction efficiency out of the light-emitting device 100 can be enhanced. A difference in refractive indices between the matrix 51 and the first fillers 52 of equal to or more than 0.03 is sufficient to enhance the light extraction efficiency of the light-emitting device 100 when the first fillers 52 are exposed.

Details of the mechanism that improves the light extraction efficiency of the light-emitting device 100 are described later.

Since the projections are formed on the upper surface 4a of the light-shielding member 4 and the upper surface 5a of the light-transmissive member, which constitute the upper surface of the light-emitting device 100, if the upper surfaces get contact with another member, the contact will be point contact. Hence, tack (adhesion) of the other member in contact can be prevented, which facilitates handling of the light-emitting device 100 in manufacture or mounting.

The wires 6 are wirings for electrically connecting electronic components such as the light-emitting elements 1 and a protective element to the lead electrodes 31 to 34. Examples of the material of the wires 6 include metals such as Au (gold), Ag (silver), Cu (copper), Pt (platinum), and Al (aluminum) and alloys of these metals. In particular, Au, which has a good thermal conductivity and the like, is preferably used. The thickness of the wires 6 is not limited to particular values and can be selected as appropriate depending on the purpose and the intended use.

Operation of Light-Emitting Device

Operation of the light-emitting device 100 will be described referring to FIG. 1C and FIG. 2A to FIG. 2C.

Figure 2A:
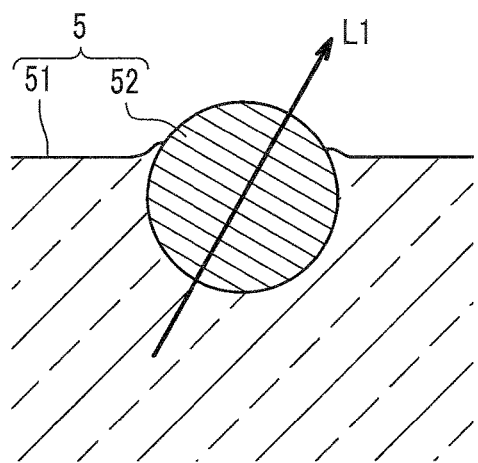
FIG. 2A is a schematic cross-sectional view of part of a light-transmissive member and a particle of a filler in the light-emitting device according to the first embodiment.
Figure 2B:
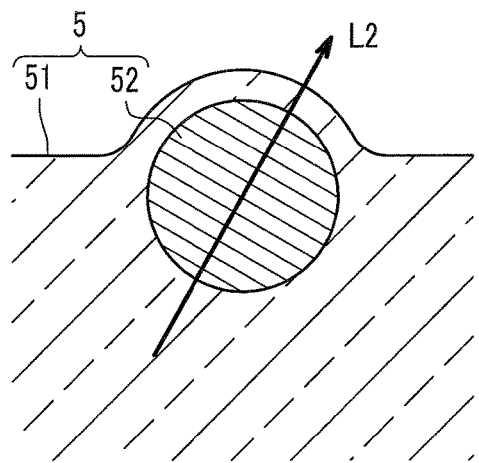
FIG. 2B is a schematic cross-sectional view of part of a light-transmissive member and a particle of a filler in a conventional light-emitting device.
Figure 2C:
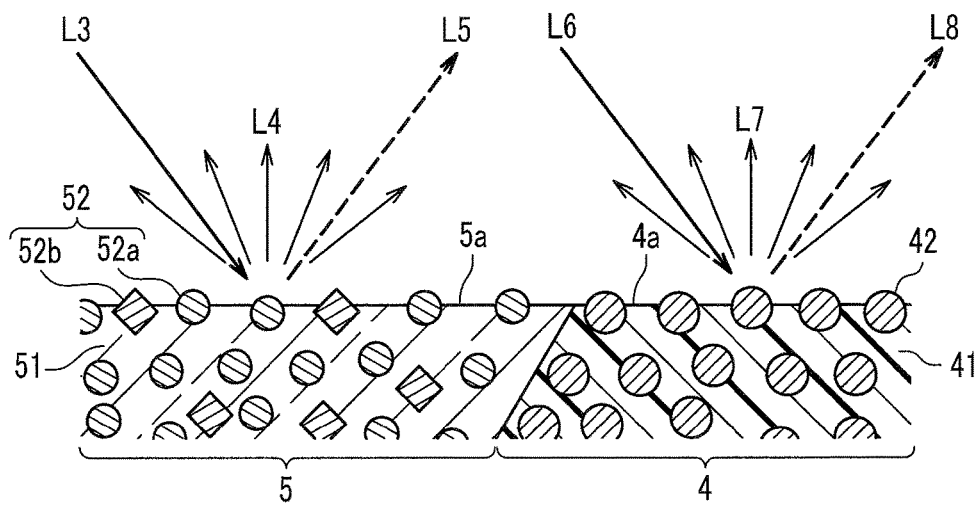
FIG. 2C is a schematic cross-sectional view for illustrating light reflection on the upper surfaces of the light-transmissive member and a light-shielding member in the light-emitting device according to the first embodiment.

FIG. 2A is a schematic cross-sectional view of part of the light-transmissive member and a particle of the filler in the light-emitting device according to the first embodiment. FIG. 2B is a schematic cross-sectional view of part of a light-transmissive member and a particle of a filler in a conventional light-emitting device. FIG. 2C is a schematic cross-sectional view for illustrating light reflection on the upper surfaces of the light-transmissive member and the light-shielding member in the light-emitting device according to the first embodiment.

In the following description, the upper surface 5a, which is the light-extracting surface of the light-emitting device 100, of the light-transmissive member 5 is assumed to be in contact with the air.

Connecting the lead electrodes 31 to 34 to an external power supply allows the light-emitting elements 1 to emit light. The light from the light-emitting elements 1 propagates through the light-transmissive member 5 and is extracted to the outside from the upper surface 5a directly or after being reflected on the bottom surface or the inner lateral surfaces of the depressed portion 2a. On the upper surface 5a, part of the light from the light-emitting elements 1 is extracted to the outside through the interface between the matrix 51 and the air. In a portion where a particle of one of the first fillers 52 is disposed near the upper surface 5a, light from the light-emitting elements 1 is extracted to the outside through the interface between the first filler 52 and the air.

The following describes the case where light is extracted to the outside through the first filler 52.

As shown in FIG. 2A, in the case where the surface of the first filler 52 is exposed from the matrix 51, a beam L1 propagating upward within the light-transmissive member 5 is extracted to the outside through the interface between the first filler 52 and the air.

As shown in FIG. 2B, in the case where the surface of the first filler 52 is covered with the matrix 51, a beam L2 propagating upward within the light-transmissive member 5 is extracted to the outside through the interface between the matrix 51 and the air.

Generally, incident light on an interface between media with different refractive indices is partially reflected depending on the difference in refractive indices. The reflectance R of light perpendicularly incident on the interface can be represented by the equation (1) below, where $n_1$ and $n_2$ are the refractive indices of the two media on both sides of the interface.

$$R=(n_1-n_2)^2/(n_1+n_2)^2 \tag{1}$$

Hence, in the case where the light-extracting surface of the light-emitting device 100 is in contact with the air, reflection of light on the interface with the air can be reduced better in the case where the first fillers 52 having smaller refractive indices, that is, having smaller differences in refractive indices from the air, constitutes the uppermost surface of the upper surface 5a, which is the light-extracting surface, of the light-transmissive member 5 than in the case where a resin serving as the matrix 51 constitutes the uppermost surface. Accordingly, the light extraction efficiency of the light-emitting device 100 can be enhanced.

In the case where light propagates from a medium having a relatively large refractive index to a medium having a small refractive index, the light is totally reflected on the interface on the basis of Snell's law. The amount of light totally reflected on the interface between the light-transmissive member 5 and the air can be reduced by reducing the difference in refractive indices at the interface. In other words, the light extraction efficiency to the outside can be enhanced also by suppressing total reflection.

In the case where the light-emitting device 100 is used as, for example, a pixel in an image display device, the upper surface of the light-emitting device 100 may be irradiated with outside light from illumination such as fluorescent lights. In the case where the upper surface of the light-emitting device 100 is flat, the upper surface is glossy and regularly (specularly) reflects a large part of components of the outside light. In the case where the upper surface 5a of the light-transmissive member 5 is irradiated with a beam L3 as the outside light as shown in FIG. 2C, a large part of the beam L3 is regularly reflected as represented by a beam L5. Hence, the surface of the light-emitting device 100 looks bright because of the regularly-reflected light component of the outside light when observed from the direction (direction of propagation of the beam L5) in which the outside light is regularly reflected, reducing the usual brightness contrast in light emitted from the light-emitting device 100. That is, what is called "gloss" of the surface reduces viewability of an image displayed by the image display device.

Here, forming projections caused by the grain diameters of the first fillers 52 on the upper surface 5a allows the beam L3 to be diffusely reflected as represented by beams L4. In other words, the regularly-reflected light component can be reduced. Accordingly, deterioration of the brightness contrast in light emitted from the light-emitting device 100 can be reduced even when observed from the direction in which the outside light is regularly reflected.

As in the case of the upper surface 5a of the light-transmissive member 5, part of a beam L6 that is outside light is regularly reflected as represented by a beam L8 on the upper surface 4a of the light-shielding member 4. Here, forming projections caused by the grain diameter of the second filler 42 on the upper surface 4a allows the beam L6 to be diffusely reflected as represented by beams L7. Accordingly, deterioration of the brightness contrast in light emitted from the light-emitting device 100 can be reduced even when observed from the direction (direction of propagation of the beam L8) in which the outside light is regularly reflected.

The surface roughnesses of the upper surface 5a and the upper surface 4a are preferably within the above range. If the surface is too rough, the upper surface 5a and the upper surface 4a of the light-emitting device 100 look cloudy, and the brightness contrast of the light-emitting device 100 may be rather deteriorated. The surface roughnesses can fall within an appropriate range if projections caused by the first fillers 52 and the second filler 42 having grain diameters within the above range are formed on the upper surface 5a and the upper surface 4a.

Method for Manufacturing Light-Emitting Device

A method for manufacturing the light-emitting device according to the first embodiment will be described referring to FIG. 3 to FIG. 6B.

Figure 3:
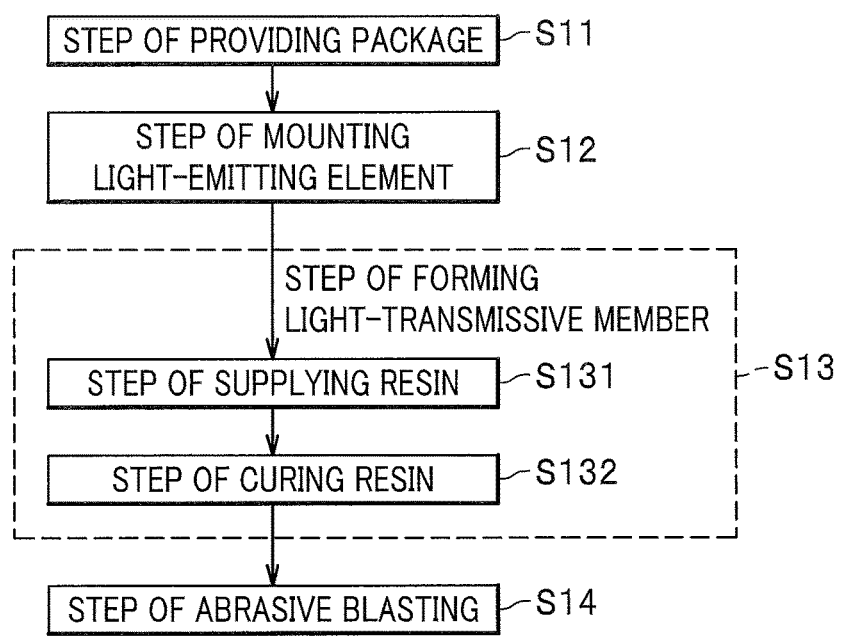
FIG. 3 is a flowchart illustrating a procedure of a method for manufacturing the light-emitting device according to the first embodiment.
Figure 4A:
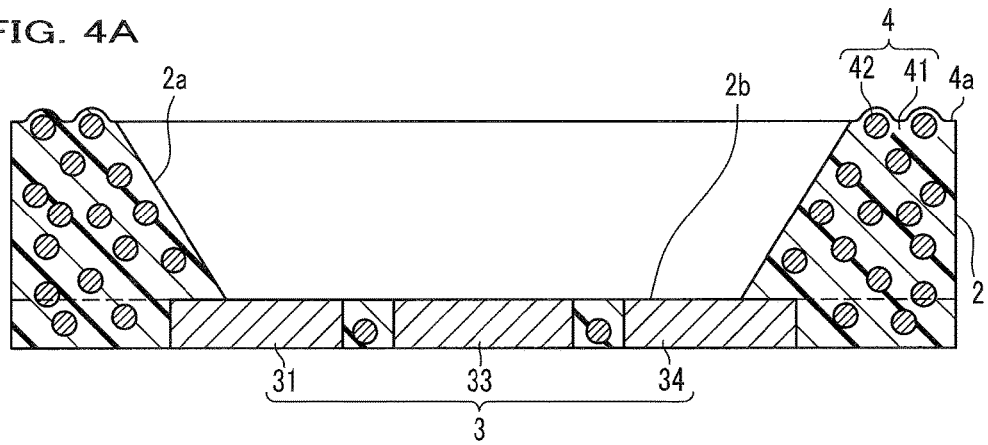
FIG. 4A is a schematic cross-sectional view for illustrating a constitution of a package provided in a step of providing a package in the method for manufacturing the light-emitting device according to the first embodiment.
Figure 4B:
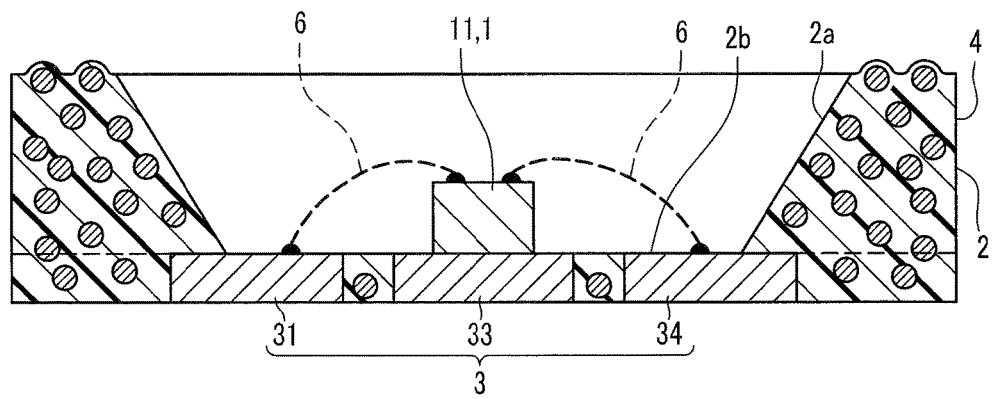
FIG. 4B is a schematic cross-sectional view for illustrating a step of mounting light-emitting elements in the method for manufacturing the light-emitting device according to the first embodiment.
Figure 4C:
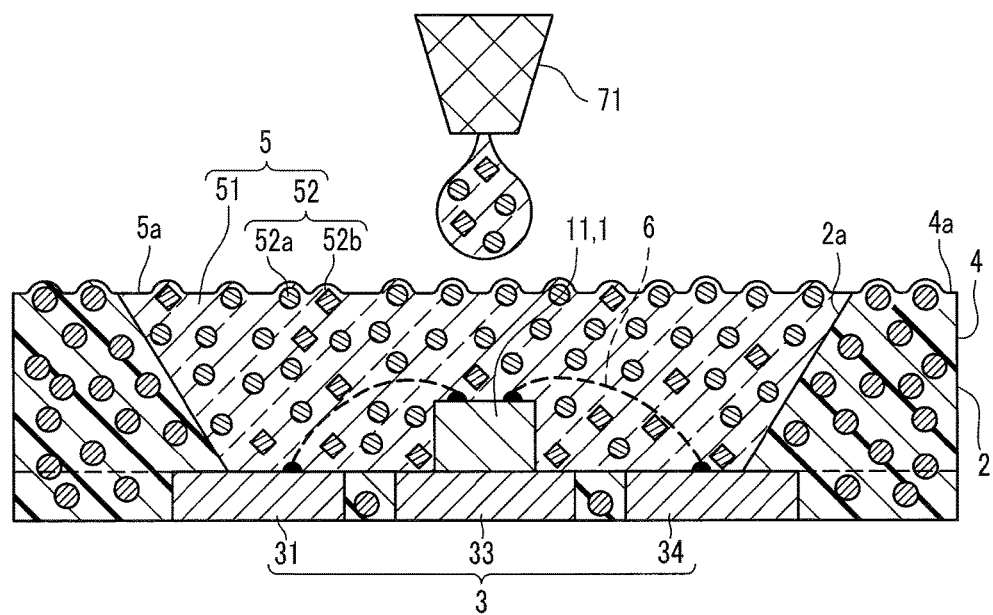
FIG. 4C is a schematic cross-sectional view for illustrating a step of supplying a resin in the method for manufacturing the light-emitting device according to the first embodiment.
Figure 4D:
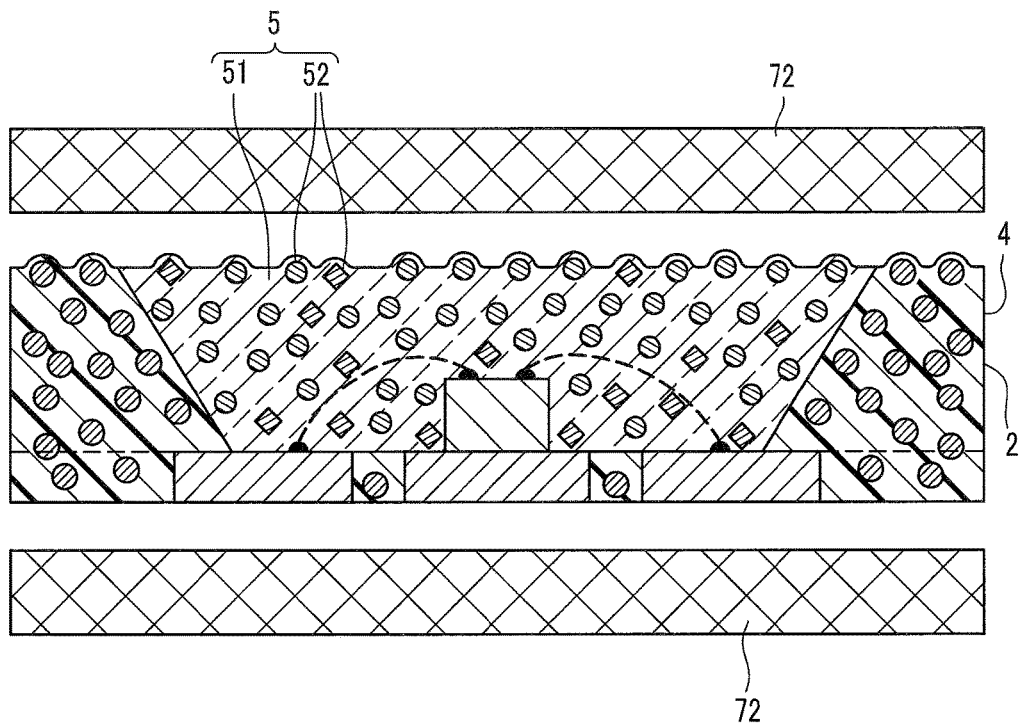
FIG. 4D is a schematic cross-sectional view for illustrating a step of curing the resin in the method for manufacturing the light-emitting device according to the first embodiment.
Figure 4E:
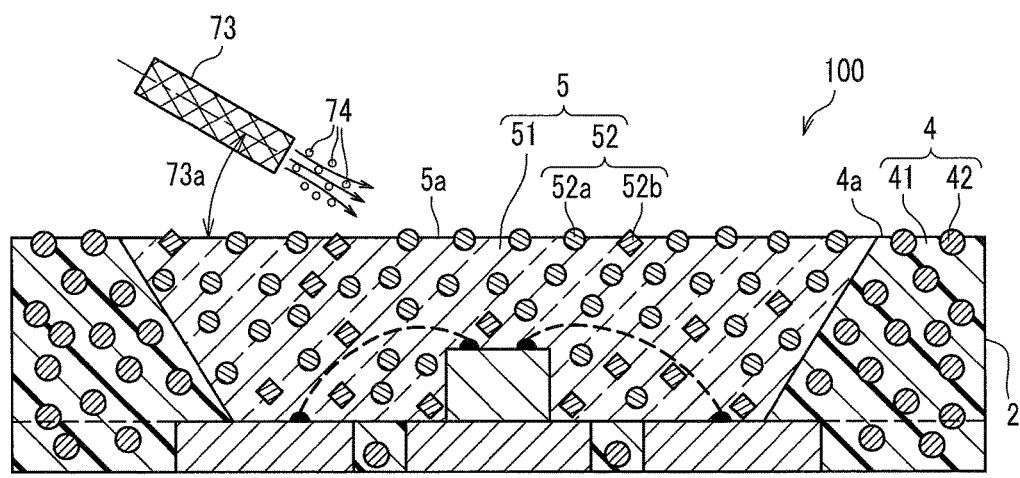
FIG. 4E is a schematic cross-sectional view for illustrating a step of abrasive blasting in the method for manufacturing the light-emitting device according to the first embodiment.
Figure 5A:
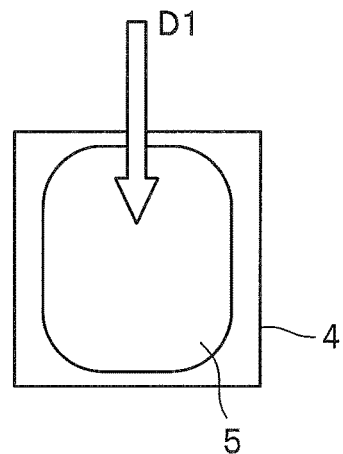
FIG. 5A is a schematic plan view of a first example of a direction in which an abrasive material is propelled in the step of abrasive blasting in the method for manufacturing the light-emitting device according to the first embodiment.
Figure 5B:
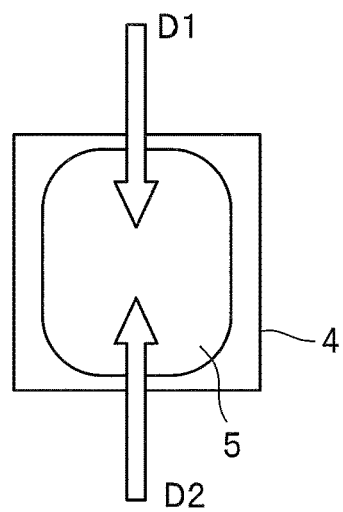
FIG. 5B is a schematic plan view of a second example of directions in which the abrasive material is propelled in the step of abrasive blasting in the method for manufacturing the light-emitting device according to the first embodiment.
Figure 5C:
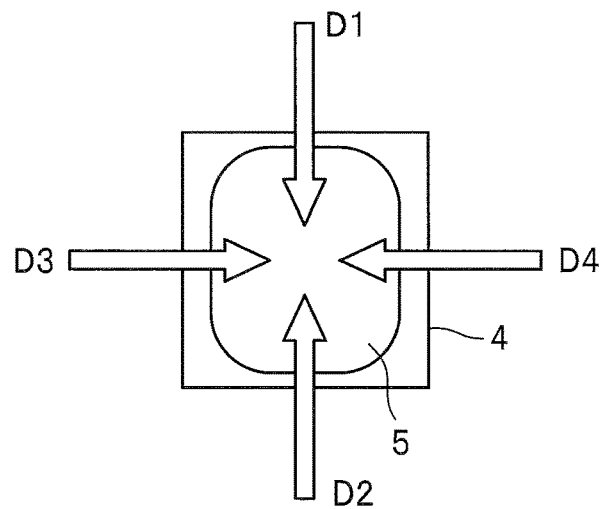
FIG. 5C is a schematic plan view of a third example of directions in which the abrasive material is propelled in the step of abrasive blasting in the method for manufacturing the light-emitting device according to the first embodiment.
Figure 6A:
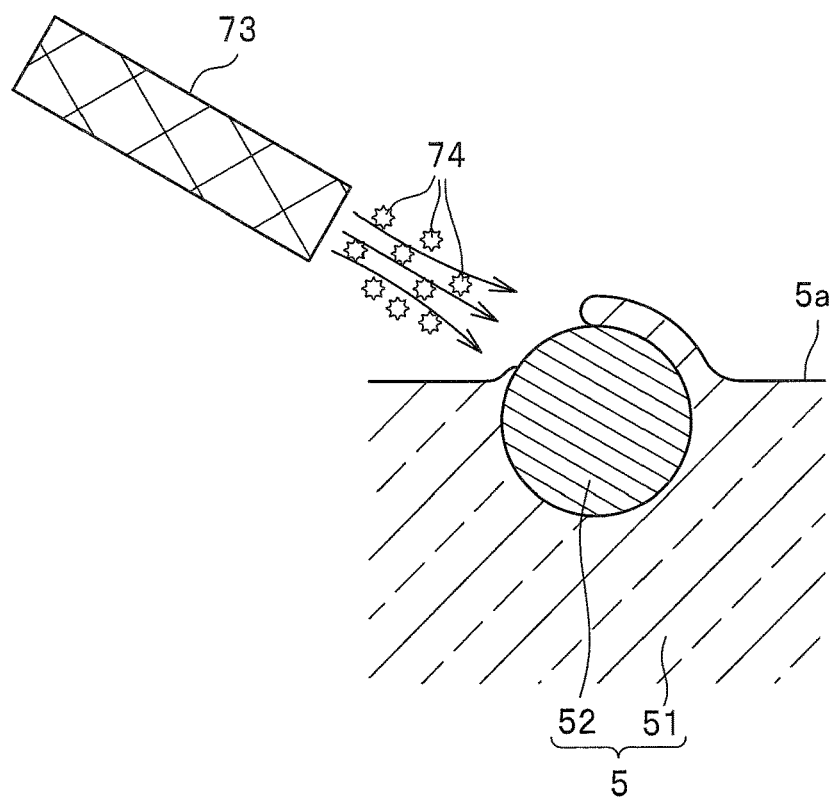
FIG. 6A is a schematic cross-sectional view for illustrating a first step in the step of abrasive blasting in the method for manufacturing the light-emitting device according to the first embodiment.
Figure 6B:
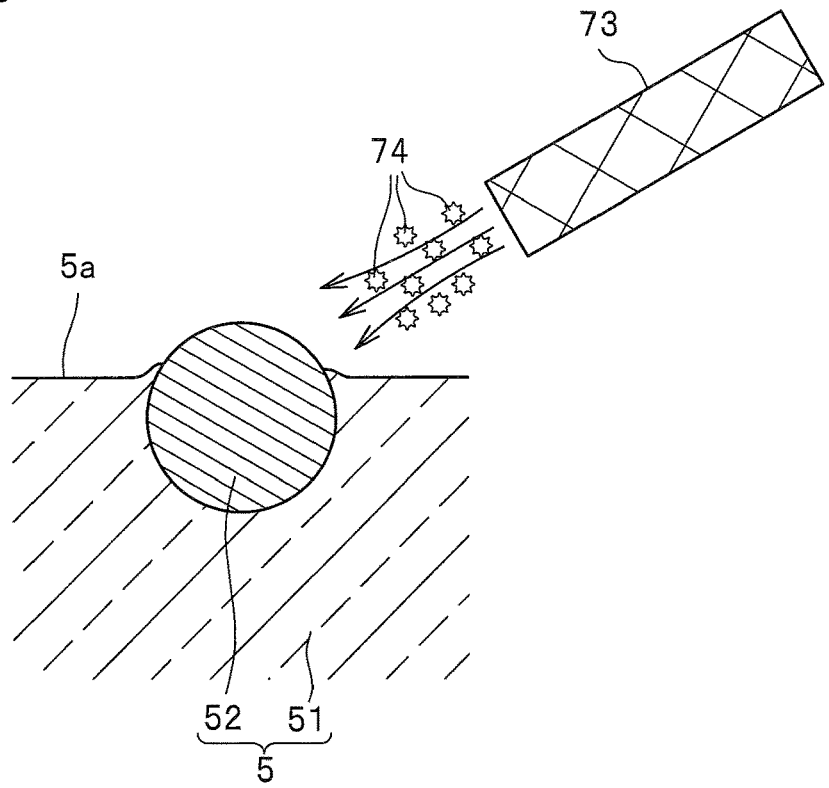
FIG. 6B is a schematic cross-sectional view for illustrating a second step in the step of abrasive blasting in the method for manufacturing the light-emitting device according to the first embodiment.

FIG. 3 is a flowchart illustrating a procedure of the method for manufacturing the light-emitting device according to the first embodiment. FIG. 4A is a schematic cross-sectional view for illustrating a constitution of the package provided in a step of providing a package in the method for manufacturing the light-emitting device according to the first embodiment. FIG. 4B is a schematic cross-sectional view for illustrating a step of mounting light-emitting elements in the method for manufacturing the light-emitting device according to the first embodiment. FIG. 4C is a schematic cross-sectional view for illustrating a step of supplying a resin in the method for manufacturing the light-emitting device according to the first embodiment. FIG. 4D is a schematic cross-sectional view for illustrating a step of curing the resin in the method for manufacturing the light-emitting device according to the first embodiment. FIG. 4E is a schematic cross-sectional view for illustrating a step of abrasive blasting in the method for manufacturing the light-emitting device according to the first embodiment. FIG. 5A is a schematic plan view of a first example of a direction in which an abrasive material is propelled in the step of abrasive blasting in the method for manufacturing the light-emitting device according to the first embodiment. FIG. 5B is a schematic plan view of a second example of directions in which the abrasive material is propelled in the step of abrasive blasting in the method for manufacturing the light-emitting device according to the first embodiment. FIG. 5C is a schematic plan view of a third example of directions in which the abrasive material is propelled in the step of abrasive blasting in the method for manufacturing the light-emitting device according to the first embodiment. FIG. 6A is a schematic cross-sectional view for illustrating a first step in the step of abrasive blasting in the method for manufacturing the light-emitting device according to the first embodiment. FIG. 6B is a schematic cross-sectional view for illustrating a second step in the step of abrasive blasting in the method for manufacturing the light-emitting device according to the first embodiment.

In FIG. 4A to FIG. 4E, the package 2 is illustrated only with an upper part that includes the bottom surface 2b and the side walls of the depressed portion 2a. A lower part of the package 2 is omitted here.

The method for manufacturing the light-emitting device 100 according to the first embodiment includes forming the light-transmissive member 5 over the light-emitting elements 1 after disposing the light-emitting elements 1 on the package 2, and abrasive-blasting the upper surface of the light-transmissive member 5 and the upper surface of the package 2. In forming the light-transmissive member 5, the light-transmissive member 5 is formed using a resin material that contains a light-transmissive resin as the matrix 51 and particles of the light-transmissive first fillers 52 having refractive indices smaller than the refractive index of the matrix 51. The abrasive blasting exposes part of the particles of the first fillers 52 from the matrix 51 of the light-transmissive member 5 on the upper surface of the light-transmissive member 5.

The method for manufacturing the light-emitting device 100 according to the first embodiment includes a step S11 of providing a package, a step S12 of mounting light-emitting elements, a step S13 of forming a light-transmissive member, and a step S14 of abrasive blasting. The step S13 of forming a light-transmissive member includes a step S131 of supplying a resin and a step S132 of curing the resin.

In the step S11 of providing a package, the package 2 is provided. The package 2 has the upward-opening depressed portion 2a that is surrounded by the light-shielding member 4 serving as the side walls and has the lead electrodes 3 on the bottom surface 2b of the package 2.

Specifically, in this step, first, a metal plate is punched by pressing to form a lead frame having the same outer shapes as those of the lead electrodes 3. Subsequently, the lead frame is sandwiched between upper and lower molds having a cavity that has a shape corresponding to the shape of the light-shielding member 4. Subsequently, a resin material containing the second filler 42 in a resin serving as the matrix 41 is injected into the cavity of the molds, the resin material is solidified or cured, and then the product is removed from the molds, so that the light-shielding member 4 is formed integrally with the lead electrodes 3. Subsequently, the lead electrodes 3 protruding from the lateral surfaces of the light-shielding member 4 are bent along the lateral surfaces and the lower surface of the light-shielding member 4, so that the package 2 is provided.

In the package 2 provided in this step, the second filler 42 near the upper surface 4a of the light-shielding member 4 is covered with the matrix 41.

In the step S12 of mounting light-emitting elements, the light-emitting elements 1 are mounted in the depressed portion 2a of the package 2. In this step, the light-emitting elements 1 (11 to 13) are die-bonded to the lead electrode 33 and are electrically connected to the corresponding lead electrodes 31 to 34 using the wires 6.

In the step S13 of forming a light-transmissive member, the light-transmissive member 5 covering the light-emitting elements 1 is formed in the depressed portion 2a after mounting the light-emitting elements 1 in the depressed portion 2a. As described above, the step S13 of forming a light-transmissive member includes the step S131 of supplying a resin and the step S132 of curing the resin.

First, in the step S131 of supplying a resin, a resin material containing the first fillers 52 (52a and 52b) in an uncured resin intended to be the matrix 51 is supplied into the depressed portion 2a by, for example, potting with a dispenser 71.

Subsequently, in the step S132 of curing the resin, the resin material is cured by heating with a heating device 72 such as a heater and a reflow oven. The light-transmissive member 5 is thus formed.

In the light-transmissive member 5 formed in this step, the first fillers 52 near the upper surface 5a are covered with the matrix 51.

In the step S14 of abrasive blasting, the upper surface 5a of the light-transmissive member 5 and the upper surface 4a of the light-shielding member 4 are abrasive-blasted. Performing this step exposes the first fillers 52 near the upper surface 5a and the second filler 42 near the upper surface 4a and forms projections caused by the first fillers 52 on the upper surface 5a and projections caused by the second filler 42 on the upper surface 4a.

Performing abrasive blasting so that the first fillers 52 and the second filler 42 will be exposed finely roughens the upper surface 5a and the upper surface 4a, thereby improving light-diffusing properties of the upper surface 5a and the upper surface 4a and providing anti-reflection effects of these surfaces.

The abrasive blasting is preferably wet blasting. For example, a slurry containing purified water and an abrasive material 74 is propelled from a nozzle 73 against a target surface. The impact of the abrasive material 74 on the target can be reduced in wet blasting compared with the impact in dry blasting. Hence, the resin material, which is comparatively soft, can be selectively scraped away and removed without severely damaging inorganic particles used as the first and second fillers 52 and 42. Also, wet blasting is suitable for fine processing because an abrasive material 74 having a smaller diameter can be used. Hence, the matrix 51 and the matrix 41 covering the surfaces of the first fillers 52 and the second filler 42 can be removed without forming coarse irregular shapes on the upper surface 5a of the light-transmissive member 5 and the upper surface 4a of the light-shielding member 4. Accordingly, the particles of the first fillers 52 and the particles of the second filler 42 can be exposed on the corresponding upper surfaces 5a and 4a to form projections caused by the particles of the first fillers 52 and the particles of the second filler 42.

Specifically, when removing the matrix 51 over the first fillers 52 near the upper surface 5a and the matrix 41 over the second filler 42 near the upper surface 4a, the abrasive blasting is performed preferably so that the first fillers 52 and the second filler 42 will be detached as little as possible from the matrix 51 and the matrix 41.

Specifically, the grain diameter of the abrasive material 74 is preferably in a range of about 3 μm to 14 μm. In the case where wet blasting using the slurry containing purified water and the abrasive material 74 is employed, the content of the abrasive material 74 in the slurry is preferably in a range of about 5% by volume to 30% by volume.

The abrasive material 74 is preferably harder than the matrix 51 and the matrix 41 to be removed in the abrasive blasting. Examples of the abrasive material 74 include alumina ($Al_2O_3$), silicon carbide (SiC), stainless steel, zirconia ($ZrO_2$), and glass.

A blast angle 73a of the slurry, which includes the abrasive material 74, is preferably in a range of 15° to 45°, more preferably about 30°, to the upper surface 5a and the upper surface 4a, which are target surfaces of the blasting.

If the abrasive material 74 is propelled at a blast angle 73a nearly perpendicular (90°) to the target surfaces of the blasting, the abrasive material 74 may easily stick into the matrix 41 and the matrix 51 and remain in the package 2 after the abrasive blasting. If the abrasive material 74 is propelled at a nearly horizontal blast angle 73a, the efficiency of removing the matrix 41 and the matrix 51 with the abrasive material 74 may be reduced. Hence, with the blast angle 73a within the above range, the matrix 51 and the matrix 41 can be efficiently removed.

In wet blasting, the above slurry and compressed air are sprayed from the nozzle 73 of a blast gun toward the target surfaces of the blasting. The pressure of the compressed air (pressure at the blast gun) can be, for example, about 0.1 MPa to 0.5 MPa, although the optimum value varies depending on the shape of the nozzle 73, the blast angle 73a, and the material, shape, and grain diameter of the abrasive material 74.

If the abrasive material 74 is propelled at the above blast angle 73a only from a direction D1 in a plan view, the matrix 51 is removed on one side (left side in FIG. 6A) of the first fillers 52 and tends to remain on the other side. Hence, after propelling the abrasive material 74 from the direction D1, it is preferable that the orientation of the nozzle 73 be changed to propel the abrasive material 74 also from an opposite direction D2 (right side in FIG. 6B).

In addition, the abrasive material 74 may be propelled also from directions D3 and D4 perpendicular to the directions D1 and D2 in a plan view. Alternatively, for example, the abrasive material 74 may be propelled from three directions different from each other by 120° in a plan view.

In the case where the abrasive material 74 is propelled from a plurality of directions, the entire upper surface 5a and the entire upper surface 4a are treated in one direction, and then the orientation of the nozzle 73 is sequentially changed to perform the treatment. The orientation of the nozzle 73 may be changed relatively to the light-emitting device 100. That is, the orientation of the light-emitting device 100 may be changed while the nozzle 73 is fixed.

The upper surface 5a of the light-transmissive member 5 has been described above, but the matrix 41 is also removed from the surface of the second filler 42 on the upper surface 4a of the light-shielding member 4 by uniformly abrasive-blasting the entire upper surface of the light-emitting device 100.

The light-emitting device 100 is manufactured by performing each step as described above.

Application Example

Constitution of Image Display Device

As an application example of the light-emitting device 100 according to the first embodiment, an image display device including the light-emitting device 100 will be described referring to FIG. 7A and FIG. 7B.

Figure 7A:
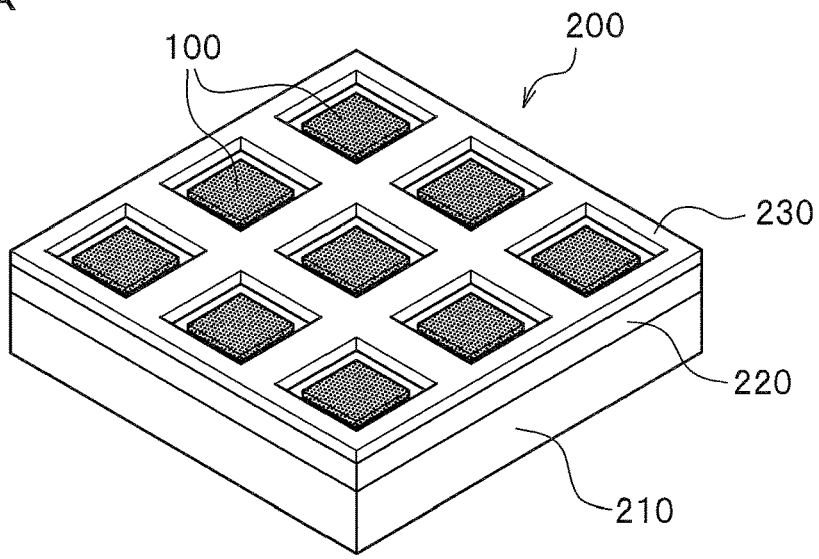
FIG. 7A is a schematic perspective view for illustrating a constitution of an image display device including the light-emitting device according to the first embodiment.
Figure 7B:
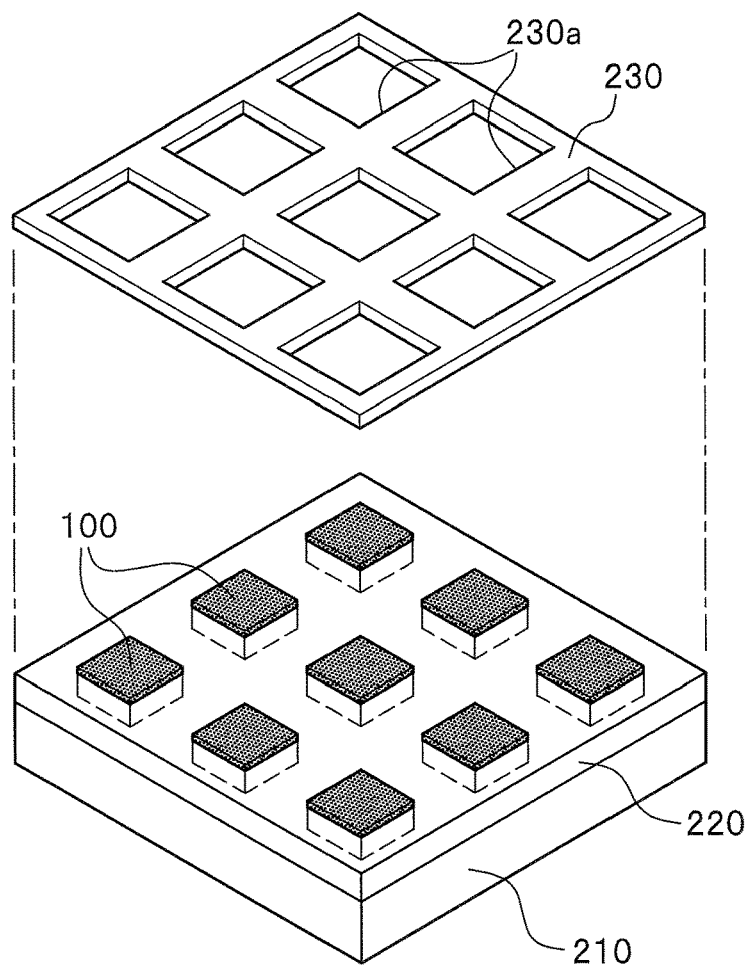
FIG. 7B is a schematic exploded perspective view for illustrating the constitution of the image display device including the light-emitting device according to the first embodiment.

FIG. 7A is a schematic perspective view for illustrating a constitution of the image display device including the light-emitting device according to the first embodiment. FIG. 7B is a schematic exploded perspective view for illustrating the constitution of the image display device including the light-emitting device according to the first embodiment.

An image display device 200 includes a circuit substrate 210, a plurality of light-emitting devices 100 mounted on the upper surface of the circuit substrate 210, a protective member 220 covering electrodes and wiring portions of the light-emitting devices 100 and the circuit substrate 210, and a frame member 230 that covers portions between the light-emitting devices 100. In the image display device 200, each light-emitting device 100 is used as one pixel.

Nine light-emitting devices 100 are mounted in a 3×3 matrix on the circuit substrate 210 in the image display device 200, but more light-emitting devices 100 may be mounted. Alternatively, an image display device including a larger number of pixels may be constituted by, for example, arranging a plurality of units each including 3×3 light-emitting devices 100 mounted on the circuit substrate 210.

The circuit substrate 210 mechanically supports and electrically connects the light-emitting devices 100. The circuit substrate 210 is formed into a rectangular flat plate. Specifically, the circuit substrate 210 may be a substrate made of glass epoxy or the like on which a drive control circuit for driving the light-emitting devices 100 and a communication circuit are mounted.

The protective member 220 prevents water such as rainwater and moisture in the ambient air from intruding into the light-emitting devices 100. The protective member 220 can be made of a waterproof material such as a silicone resin and is formed to cover the lateral surfaces of the light-emitting devices 100 on the circuit substrate 210.

The frame member 230 protects the circuit substrate 210 and the protective member 220 on the circuit substrate 210. The frame member 230 is formed into a rectangular flat plate and has approximately the same area as the circuit substrate 210. The frame member 230 has the same number of openings 230a as that of the light-emitting devices 100. The openings 230a each have an area corresponding to the area of a single light-emitting device 100. The frame member 230 is joined to the circuit substrate 210 with screw members or the like so that the upper surfaces of the light-emitting devices 100 will be exposed through the openings 230a.

The frame member 230 can be formed of a material such as a metal, a resin, and a ceramic, and its upper surface is preferably roughened or the like to suppress regular reflection of the outside light.

As described above, a plurality of projections on the upper side of the light-emitting devices 100 reduce the regularly-reflected light component of the outside light. Hence, effects of the outside light are reduced in the image display device 200 including the light-emitting devices 100 as pixels, and the brightness and the color of each pixel can be recognized well independently of the direction of observation.

Second Embodiment

Constitution of Light-Emitting Device

A light-emitting device according to a second embodiment will be described referring to FIG. 8A to FIG. 8C.

Figure 8A:
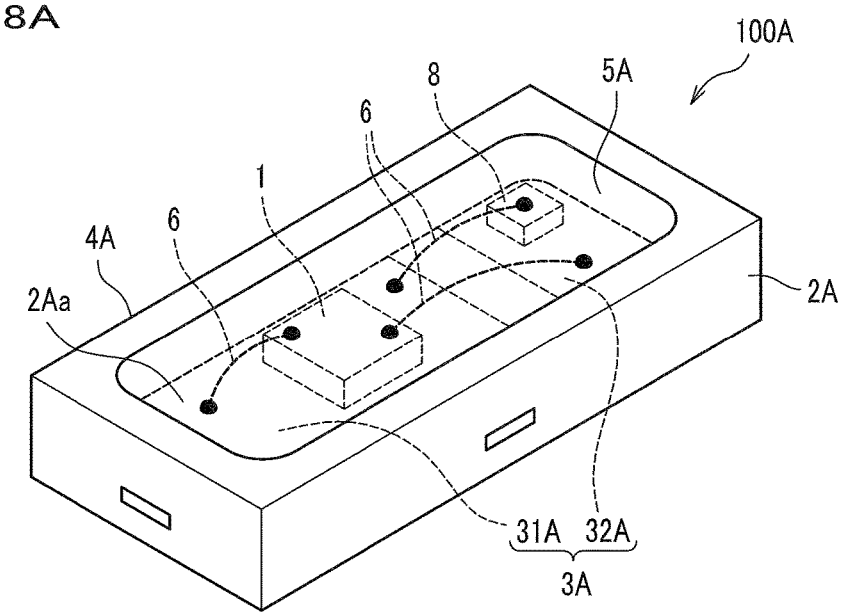
FIG. 8A is a schematic perspective view for illustrating a constitution of a light-emitting device according to a second embodiment.
Figure 8B:
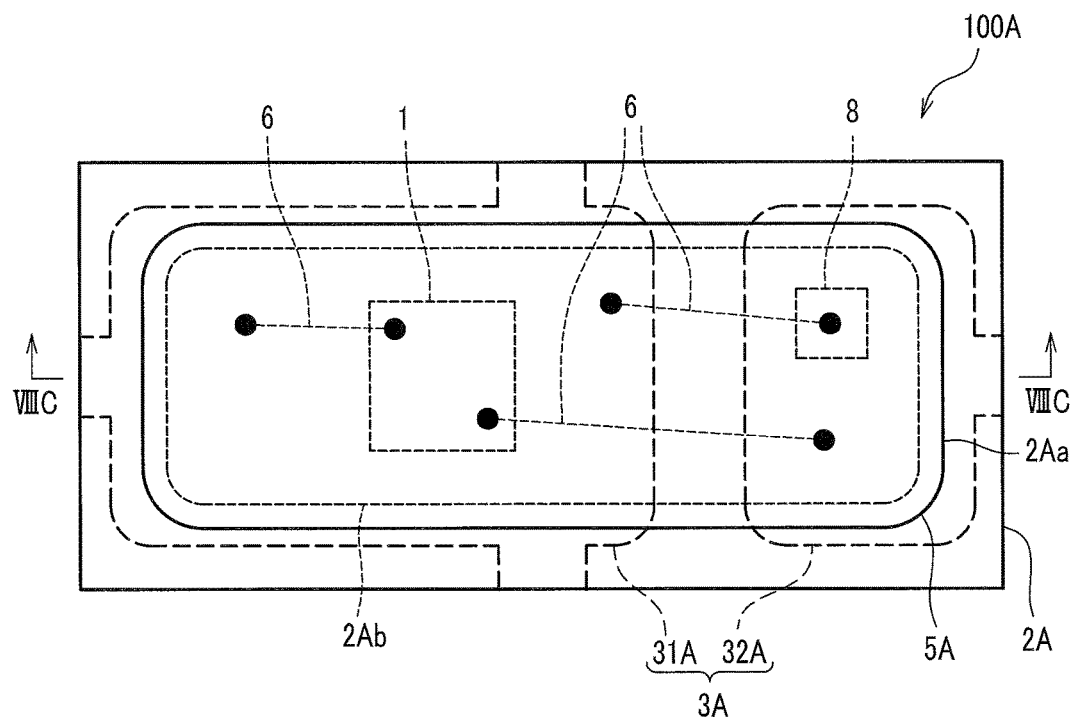
FIG. 8B is a schematic plan view for illustrating the constitution of the light-emitting device according to the second embodiment.

FIG. 8A is a schematic perspective view for illustrating a constitution of the light-emitting device according to the second embodiment. FIG. 8B is a schematic plan view for illustrating the constitution of the light-emitting device according to the second embodiment. FIG. 8C is a schematic cross-sectional view for illustrating the constitution of the light-emitting device according to the second embodiment taken along the line VIIIC-VIIIC in FIG. 8B.

Figure 8C:
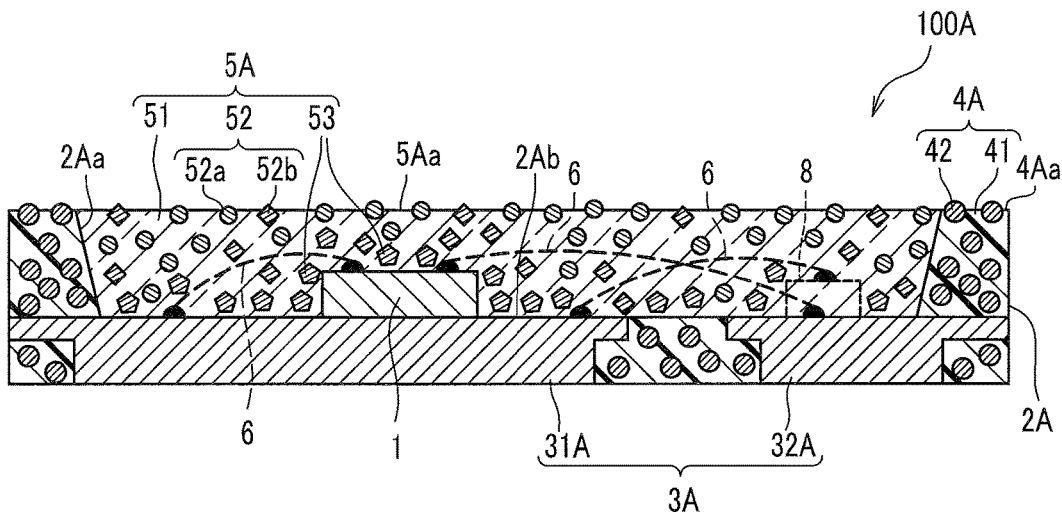
FIG. 8C is a schematic cross-sectional view for illustrating the constitution of the light-emitting device according to the second embodiment taken along the line VIIIC-VIIIC in FIG. 8B.

In FIG. 8C, the two types of first fillers are represented by circles and rhombi, the second filler is represented by circles, and a wavelength conversion substance is represented by pentagons. These shapes do not represent specific shapes of corresponding members but are used for convenience to differentiate the types of filler particles.

A light-emitting device 100A according to the second embodiment has a rectangular shape in a plan view and includes a package 2A having an upward-opening depressed portion 2Aa, the light-emitting element 1 mounted in the depressed portion 2Aa, and a light-transmissive member 5A disposed in the depressed portion 2Aa and encapsulating the light-emitting element 1. The package 2A includes lead electrodes 3A and a light-shielding member 4A. The light-emitting element 1 is electrically connected using wires 6 to the lead electrodes 3A disposed on the bottom surface of the depressed portion 2Aa. In the light-emitting device 100A, a protective element 8 is mounted in the depressed portion 2Aa.

The protective element 8 is, for example, a Zener diode and protects the light-emitting element 1 against electrostatic discharge damage.

The light-emitting device 100A according to the second embodiment includes the package 2A that differs in outer shape from the package 2 in the light-emitting device 100 according to the first embodiment. In addition, the light-emitting device 100A differs from the light-emitting device 100 in that only one light-emitting element 1 is mounted, that the protective element 8 is mounted, and that the light-transmissive member 5A contains particles of a wavelength conversion substance 53 in addition to the first fillers 52 (52a and 52b).

The package 2A includes the lead electrodes 3A and the light-shielding member 4A and has an approximately rectangular outer shape in a plan view. The package 2A has the upward-opening depressed portion 2Aa. The depressed portion 2Aa is a region on which the light-emitting element 1 is mounted. The lead electrodes 3A and the light-shielding member 4A constitute a bottom surface 2Ab of the depressed portion 2Aa. The light-shielding member 4A constitutes the side walls of the depressed portion 2Aa.

The lower surface of the package 2A is flat, and lead electrodes 31A and 32A are exposed on the lower surface. The lower surface is the mounting surface of the light-emitting device 100A.

The lead electrodes 3A includes the lead electrode 31A and the lead electrode 32A that are flat plates and are disposed away from each other on the bottom of the package 2A. The peripheral edges of the lead electrodes 31A and 32A have steps in which the lower side is depressed to prevent detachment from the light-shielding member 4A.

Part of the upper surfaces of the lead electrodes 31A and 32A constitute the bottom surface 2Ab of the depressed portion 2Aa. The light-emitting element 1 is die-bonded to the lead electrode 31A, and the protective element 8 is die-bonded to the lead electrode 32A. The light-emitting element 1 is electrically connected to the lead electrodes 31A and 32A via the wires 6. One electrode on the lower side of the protective element 8 is electrically connected to the lead electrode 32A by the die bonding, and the other electrode on the upper side is electrically connected to the lead electrode 31A via one of the wires 6.

The light-shielding member 4A may be formed of substantially the same material as of the light-shielding member 4 in the first embodiment, and part of the particles of the second filler 42 is exposed on an upper surface 4Aa.

The light-transmissive member 5A is disposed in the depressed portion 2Aa and encapsulates the light-emitting element 1 and the protective element 8. The light-transmissive member 5A contains the particles of the wavelength conversion substance 53 in addition to the first fillers 52 (52a and 52b) in the matrix 51. On the upper surface 5Aa of the light-transmissive member 5A, part of the particles of the first fillers 52 is exposed from the matrix 51. The wavelength conversion substance 53 is disposed mainly around the light-emitting element 1 and near the bottom surface 2Ab of the depressed portion 2Aa so as not to be exposed on the upper surface 5Aa.

Substantially the same materials as in the light-transmissive member 5 in the first embodiment can be used for the matrix 51 and the first fillers 52.

The wavelength conversion substance 53 is a fluorescent material that absorbs light from the light-emitting element 1 partially or entirely and emits light having a different wavelength, thereby achieving wavelength conversion.

For example, a light-emitting element 1 that emit blue light can be combined with a wavelength conversion substance 53 that absorbs blue light and emits yellow light, thereby generating white light. The number of types of the wavelength conversion substance 53 is not limited to one, and a plurality of wavelength conversion substances 53 different from each other in emission colors may be used.

A substance that absorbs light from the light-emitting element 1 and performs wavelength conversion can be used as the wavelength conversion substance 53. The wavelength conversion substance 53 preferably has a specific gravity larger than the specific gravity of the uncured matrix 51 of the light-transmissive member 5A in manufacture. If the specific gravity of the wavelength conversion substance 53 is larger than the specific gravity of the uncured matrix 51, the particles of the wavelength conversion substance 53 can settle down and can be disposed near the light-emitting element 1 and the surfaces of the lead electrodes 31A and 32A at the time of forming the light-transmissive member 5A in manufacture.

The efficiency of wavelength conversion can be enhanced by disposing the wavelength conversion substance 53 near the light-emitting element 1 and the surfaces of the lead electrodes 31A and 32A. Also, disposing the wavelength conversion substance 53 so as not to be exposed on the upper surface 5Aa can suppress deterioration and changes in quality of the wavelength conversion substance 53 due to contact with the ambient air.

Specific examples of the wavelength conversion substance 53 include yellow fluorescent materials such as YAG fluorescent materials represented by $Y_3Al_5O_{12}$:Ce and silicates, and red fluorescent materials such as CASN fluorescent materials represented by $CaAlSiN_3$:Eu and KSF fluorescent materials represented by $K_2SiF_6$:Mn.

Operation of Light-Emitting Device

In the light-emitting device 100A, light from the light-emitting element 1 is partially or entirely converted by the wavelength conversion substance 53 and is extracted to the outside from the upper surface 5Aa, which is the light-extracting surface, of the light-transmissive member 5A.

As in the first embodiment, "gloss" of the surface is reduced because at least part of the outside light incident on the upper surface of the light-emitting device 100A is diffusely reflected by a plurality of projections on the upper surface 5Aa and the upper surface 4Aa. Also, as in the first embodiment, the light extraction efficiency is improved by exposing part of the first fillers 52 on the upper surface 5Aa of the light-transmissive member 5A.

Method for Manufacturing Light-Emitting Device

A method for manufacturing the light-emitting device according to the second embodiment will be described referring to FIG. 8A to FIG. 8C and FIG. 9.

Figure 9:
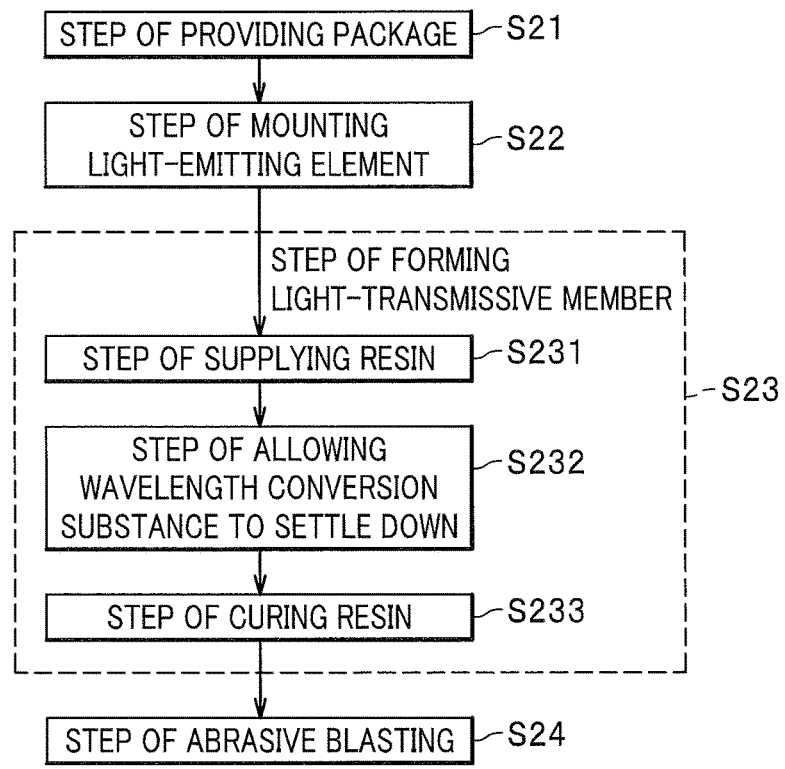
FIG. 9 is a flowchart illustrating a method for manufacturing the light-emitting device according to the second embodiment.

FIG. 9 is a flowchart illustrating the method for manufacturing the light-emitting device according to the second embodiment.

The method for manufacturing the light-emitting device 100A according to the second embodiment includes a step S21 of providing a package, a step S22 of mounting a light-emitting element, a step S23 of forming a light-transmissive member, and a step S24 of abrasive blasting. The step S23 of forming a light-transmissive member includes a step S231 of supplying a resin, a step S232 of allowing a wavelength conversion substance to settle down, and a step S233 of curing the resin.

In the step S21 of providing a package, the package 2A is provided. The package 2A can be provided in substantially the same way as the step S11 of providing a package in the first embodiment except that the shape of the package to be provided is different.

In the package 2A provided in this step, the second filler 42 near the upper surface 4Aa of the light-shielding member 4A is covered with the matrix 41.

In the step S22 of mounting a light-emitting element, the light-emitting element 1 is mounted in the depressed portion 2Aa of the package 2A. The light-emitting element 1 can be mounted in substantially the same way as the step S12 of mounting light-emitting elements in the first embodiment.

The protective element 8 is also mounted in the depressed portion 2Aa in this step.

In the step S23 of forming a light-transmissive member, the light-transmissive member 5A is formed in the depressed portion 2Aa. This step includes the step S231 of supplying a resin, the step S232 of allowing a wavelength conversion substance to settle down, and the step S233 of curing the resin, as described above.

The step S231 of supplying a resin can be performed in substantially the same way as the step S131 of supplying a resin in the first embodiment. A resin material to be supplied into the depressed portion 2Aa is prepared so as to contain the first fillers 52 and the wavelength conversion substance 53 in the uncured matrix 51. The materials of the wavelength conversion substance 53 and the matrix 51 are preferably selected so that the specific gravity of the wavelength conversion substance 53 will be larger than the specific gravity of the uncured matrix 51.

In the step S232 of allowing a wavelength conversion substance to settle down, the wavelength conversion substance 53 contained in the resin material is allowed to settle down after the uncured resin material is supplied into the depressed portion 2Aa in the step S231 of supplying a resin. Specifically, the resin material is allowed to stand still until the wavelength conversion substance 53 having a specific gravity larger than the specific gravity of the uncured matrix 51 settles down by gravity and comes near the light-emitting element 1 and the surfaces of the lead electrodes 31A and 32A.

The step S233 of curing the resin can be performed in substantially the same way as the step S132 of curing the resin in the first embodiment, and its description is hence omitted.

The step S24 of abrasive blasting can be performed in substantially the same way as the step S14 of abrasive blasting in the first embodiment, and its description is hence omitted.

In the case where the wavelength conversion substance 53 is not allowed to settle down, the step S233 of curing the resin is performed promptly after the step S231 of supplying a resin.

Performing the above steps enables the light-emitting device 100A to be manufactured.

Example

Examples of the present invention will be described.

Light-emitting devices having the configuration shown in FIG. 1A and light-emitting devices having the configuration shown in FIG. 8A are each produced by the above manufacturing methods. At this time, a plurality of samples different in conditions in abrasive blasting are produced.

Shape and Material of Light-Emitting Device: Samples of First Embodiment

Light-Transmissive Member:

Matrix: epoxy resin (with a refractive index of 1.53)

First filler: silica ($SiO_2$) (with a refractive index of 1.46 and a grain diameter of 1.5 μm, its content being 40% by mass)

Light-Shielding Member (Light-Absorptive Member):

Matrix: polyphthalamide resin

Second filler: carbon black (with a grain diameter of 3 μm, its content being 1% by mass)

Package:

Outer dimensions in a plan view: 3 mm on a side

Opening diameter of light-transmissive member: 2.6 mm on a side

Light-emitting element: one blue LED, one green LED, and one red LED mounted
Shape and Material of Light-Emitting Device: Samples of Second Embodiment
Light-Transmissive Member:
Matrix: silicone resin (with a refractive index of 1.52)
First filler member: silica ($SiO_2$) (with a refractive index of 1.46 and a grain diameter of 6 μm, its content being 15% by mass)
Wavelength conversion substance: YAG fluorescent material
Light-Shielding Member (Light-Reflective Member):
Matrix: epoxy resin
Second filler: $TiO_2$ (with a grain diameter of 0.3 μm, its content being 17% by mass)
Package:
Outer dimensions in a plan view: 3 mm in long side and 1.4 mm in short side
Opening diameter of light-transmissive member: 2.6 mm in long side and 1.0 mm in short side
Light-Emitting Element: One Blue LED Mounted
Conditions in Abrasive Blasting: Common to Samples of Both Embodiments
Abrasive Liquid (Slurry):
Solvent: purified water
Abrasive material: alumina ($Al_2O_3$) (with a grain diameter (D50) of 3 μm, its content being 5% by volume)
Blast angle: 30°/90°
Blast direction: one direction/two directions/four directions
Pressure at blast gun: 0.2/0.3/0.4 (MPa)
Blasting speed: 40 mm/second
The upper surfaces of the samples of the light-emitting devices were abrasive-blasted by applying an air pressure to spray the abrasive liquid from a nozzle as a mist under the above conditions.
Evaluation
The samples produced under different conditions in abrasive blasting were evaluated for light output, anti-reflection effects of the upper surface, surface roughness of the upper surface, and falling off of the fillers (first and second fillers) on the basis of a sample without abrasive blasting.
It was confirmed that the fillers had been exposed on the blasted surface of any of the samples abrasive-blasted under different conditions.
The higher the pressure at the blast gun was, the more fillers were exposed, and the fillers had fallen off the surfaces in some samples. Provided that the other conditions were the same, the higher the pressure at the blast gun was, the higher the light output (luminous flux) was. The light output was improved by 1 to 2.9% for the samples of the first embodiment and by 0.3 to 0.9% for the samples of the second embodiment.
In the case where the blast angle was 90°, that is, the abrasive material was propelled perpendicularly to the surface to be blasted, the fillers were less exposed than in the case of a blast angle of 30° compared under the same pressure at the blast gun.
In the case where the propelling was performed at a blast angle of 30° from one direction, the fillers were exposed on the side facing the blast direction while the opposite side behind the fillers themselves were less exposed. In the case where two, or even four blast directions were used, the fillers were more exposed. The fillers were more exposed than in the case of a blast angle of 90°. This increase seems to be because the abrasive material could more easily peel the resin because of the blast angle smaller than the right angle.

The light output of a sample blasted at a blast angle of 30° and a pressure at the blast gun of 0.2 MPa from four blast directions was improved to about the same extent as in the case of a sample treated at a blast angle of 90° and a pressure at the blast gun of 0.4 MPa.

Anti-reflection effects against the outside light could be visually observed for every sample compared with the sample without abrasive blasting.

The surface roughness (arithmetic mean roughness Ra) of the upper surface of every sample was approximately the same as the surface roughness of the sample without abrasive blasting. In other words, it could be confirmed that only the resin covering the surfaces of the fillers was removed without causing such damage to the body of the light-transmissive member, which is a resin member, that forms a very irregular shape by the abrasive blasting.

INDUSTRIAL APPLICABILITY

The light-emitting devices according to the embodiments of the present disclosure can be used for light sources for backlights of liquid-crystal displays, a variety of lighting apparatuses, large format displays, and various displays for advertisements or destination guide, as well as digital video cameras, image scanners in apparatuses such as facsimile machines, copying machines, and scanners, projectors, and other apparatuses.

The invention claimed is:
1. A method for manufacturing a light-emitting device, the light-emitting device comprising:
  a base;
  a light-emitting element disposed on the base; and
  a light-transmissive member covering the light-emitting element,
  the method comprising:
  forming the light-transmissive member over the light-emitting element after disposing the light-emitting element on the base; and
  abrasive-blasting an upper surface of the light-transmissive member and an upper surface of the base,
  wherein, in the forming of the light-transmissive member, the light-transmissive member is formed using a resin material, the resin material comprising:
  a light-transmissive resin as a matrix; and
  particles of at least one light-transmissive first filler having refractive indices smaller than a refractive index of the matrix,
  wherein the abrasive blasting is wet blasting of propelling a slurry, the slurry comprising:
  water; and
  an abrasive material, and
  wherein, in the abrasive blasting, a part of the particles of the at least one light-transmissive first filler is exposed from the matrix of the light-transmissive member on the upper surface of the light-transmissive member.
2. The method according to claim 1,
  wherein the base comprises:
  at least one lead electrode; and
  a light-shielding member holding the at least one lead electrode.
3. The method according to claim 1,
  wherein the base has an upward-opening depressed portion, and
  wherein the light-emitting element is disposed in the upward-opening depressed portion.

4. The method according to claim 1,
wherein the particles of the at least one light-transmissive first filler has a grain diameter determined by an air permeability method or Fisher-SubSieve-Sizers-No. in a range of 0.5 μm to 10 μm.

5. The method according to claim 1,
wherein, in the abrasive blasting, the slurry is propelled against the upper surface of the light-transmissive member at an angle in a range of 15° to 45°.

6. The method according to claim 5,
wherein, in the abrasive blasting, the slurry is propelled sequentially from equal to or more than two different directions in a plan view.

7. The method according to claim 2,
wherein the light-shielding member is formed using a resin material, the resin material comprising:
a resin as a matrix; and
particles of a second filler dispersed in the matrix, and
wherein a part of the particles of the second filler is exposed from the matrix of the light-shielding member on an upper surface of the light-shielding member in the abrasive blasting.

8. The method according to claim 3,
wherein the light-transmissive member is formed using a resin material, the resin material comprising:
the particles of the at least one light-transmissive first filler;
the matrix of the light-transmissive member; and
particles of a wavelength conversion substance converting light from the light-emitting element into light having a different wavelength, and
wherein the forming of the light-transmissive member comprises:
supplying an uncured resin material into the upward-opening depressed portion, the uncured resin material comprising:
the particles of the at least one light-transmissive first filler; and
the particles of the wavelength conversion substance;
allowing the particles of the wavelength conversion substance to settle down; and
curing the resin material.

9. A method for manufacturing a light-emitting device, the light-emitting device comprising:
a base comprising at least one lead electrode and a light-shielding member holding the at least one lead electrode;
a light-emitting element disposed on the base; and
a light-transmissive member covering the light-emitting element, the method comprising:
forming the light-transmissive member over the light-emitting element after disposing the light-emitting element on the base; and
abrasive-blasting an upper surface of the light-transmissive member and an upper surface of the base, wherein, in the forming of the light-transmissive member, the light-transmissive member is formed using a first resin material, the first resin material comprising:
a light-transmissive resin as a first matrix; and
particles of at least one light-transmissive first filler having refractive indices smaller than a refractive index of the first matrix,
wherein, in the abrasive blasting, a part of the particles of the at least one light-transmissive first filler is exposed from the first matrix of the light-transmissive member on the upper surface of the light-transmissive member,
wherein the light-shielding member is formed using a second resin material, the second resin material comprising:
a resin as a second matrix; and
particles of a second filler dispersed in the second matrix, and
wherein, in the abrasive blasting, a part of the particles of the second filler is exposed from the second matrix of the light-shielding member on an upper surface of the light-shielding member.

10. A method for manufacturing a light-emitting device, the light-emitting device comprising:
a base having an upward-opening depressed portion;
a light-emitting element disposed in the upward-opening depressed portion of the base; and
a light-transmissive member covering the light-emitting element, the method comprising:
forming the light-transmissive member over the light-emitting element after disposing the light-emitting element on the base; and
abrasive-blasting an upper surface of the light-transmissive member and an upper surface of the base,
wherein, in the forming of the light-transmissive member, the light-transmissive member is formed using a resin material, the resin material comprising:
a light-transmissive resin as a matrix; and
particles of at least one light-transmissive first filler having refractive indices smaller than a refractive index of the matrix,
wherein, in the abrasive blasting, a part of the particles of the at least one light-transmissive first filler is exposed from the matrix of the light-transmissive member on the upper surface of the light-transmissive member,
wherein the light-transmissive member is formed using the resin material, the resin material comprising:
the particles of the at least one light-transmissive first filler,
the matrix of the light-transmissive member; and
particles of a wavelength conversion substance converting light from the light-emitting element into light having a different wavelength, and
wherein the forming of the light-transmissive member comprises:
supplying an uncured resin material into the upward-opening depressed portion, the uncured resin material comprising:
the particles of the at least one light-transmissive first filler; and
the particles of the wavelength conversion substance;
allowing the particles of the wavelength conversion substance to settle down; and
curing the resin material.

* * * * *